United States Patent
Chen et al.

(10) Patent No.: US 11,013,116 B2
(45) Date of Patent: May 18, 2021

(54) FLEXIBLE ASSEMBLY FOR DISPLAY DEVICE AND DISPLAY DEVICE

(71) Applicant: BOE TECHNOLOGY GROUP CO., LTD., Beijing (CN)

(72) Inventors: Liqiang Chen, Beijing (CN); Paoming Tsai, Beijing (CN); Weifeng Zhou, Beijing (CN); Chen Xu, Beijing (CN); Jifeng Tan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/621,521

(22) PCT Filed: Mar. 27, 2019

(86) PCT No.: PCT/CN2019/079847
§ 371 (c)(1),
(2) Date: Dec. 11, 2019

(87) PCT Pub. No.: WO2019/228036
PCT Pub. Date: Dec. 5, 2019

(65) Prior Publication Data
US 2020/0100361 A1 Mar. 26, 2020

(30) Foreign Application Priority Data
May 31, 2018 (CN) .......................... 201810551451.2

(51) Int. Cl.
*H05K 1/02* (2006.01)
*H05K 1/11* (2006.01)
(Continued)

(52) U.S. Cl.
CPC ............. *H05K 1/118* (2013.01); *H05K 1/147* (2013.01); *H05K 2201/09418* (2013.01); *H05K 2201/10128* (2013.01)

(58) Field of Classification Search
CPC ... H05K 1/02; H05K 1/11; H05K 1/14; H05K 1/18; H05K 3/00; H05K 3/10; H05K 3/30;
(Continued)

(56) References Cited

U.S. PATENT DOCUMENTS 5,592,199 A * 1/1997 Kawaguchi ......... G02F 1/13452
257/E23.065
5,818,114 A * 10/1998 Pendse .................... H01L 24/48
257/786
(Continued)

FOREIGN PATENT DOCUMENTS

CN 1406455 A 3/2003
CN 101266746 A 9/2008
(Continued)

OTHER PUBLICATIONS

First Chinese Office Action dated Apr. 29, 2020, received for corresponding Chinese Application No. 201810551451.2, 18 pages.

*Primary Examiner* — Xiaoliang Chen
(74) *Attorney, Agent, or Firm* — Kinney & Lange, P.A.

(57) ABSTRACT

A flexible assembly for a display device and the display device are provided. The flexible assembly includes a flexible substrate, and a first output pad, a second output pad, a third output pad and a fourth output pad that are arranged on the substrate. The first output pad, the second output pad, the third output pad and the fourth output pad are sequentially arranged along a first direction and are spaced apart from each other. A pitch is between each output pad and an adjacent output pad, and the pitch is a sum of a spacing distance between each output pad and the adjacent output pad and a width of the adjacent output pad in the first direction. The pitch between the first output pad and the (Continued)

adjacent second output pad is smaller than the pitch between the third output pad and the adjacent fourth output pad.

15 Claims, 5 Drawing Sheets

(51) Int. Cl.
| | | |
|---|---|---|
| *H05K 1/14* | (2006.01) | |
| *H05K 1/18* | (2006.01) | |
| *H05K 3/00* | (2006.01) | |
| *H05K 3/10* | (2006.01) | |
| *H05K 3/30* | (2006.01) | |
| *H05K 3/36* | (2006.01) | |
| *H01L 23/00* | (2006.01) | |
| *H01L 23/48* | (2006.01) | |
| *H01L 23/52* | (2006.01) | |
| *H01L 23/498* | (2006.01) | |
| *G06F 3/033* | (2013.01) | |
| *G06F 3/038* | (2013.01) | |
| *G06F 3/041* | (2006.01) | |
| *G06F 3/044* | (2006.01) | |

(58) Field of Classification Search
CPC ........... H05K 3/36; H01L 23/00; H01L 23/48; H01L 23/52; H01L 23/498; G06F 3/033; G06F 3/038; G06F 3/041; G06F 3/044
USPC ........... 361/749, 750; 174/261; 345/98, 100, 345/174, 177, 206; 349/38, 149, 152, 349/153; 439/67
See application file for complete search history.

(56) References Cited

U.S. PATENT DOCUMENTS

| | | | | |
|---|---|---|---|---|
| 5,951,304 | A * | 9/1999 | Wildes | H05K 1/111 439/67 |
| 8,035,790 | B2 * | 10/2011 | Onodera | H05K 3/361 349/152 |
| 8,179,353 | B2 * | 5/2012 | Imajo | G02F 1/13452 345/98 |
| 8,638,313 | B2 * | 1/2014 | Kinoshita | G06F 3/044 345/174 |
| 9,960,132 | B1 * | 5/2018 | Chen | H01L 24/08 |
| 10,211,142 | B1 * | 2/2019 | Chen | H01L 23/49838 |
| 10,242,605 | B2 * | 3/2019 | Chen | H01L 24/13 |
| 10,665,151 | B2 * | 5/2020 | Zhang | H05K 1/111 |
| 10,713,988 | B2 * | 7/2020 | Kwon | G09G 3/20 |
| 2002/0080319 | A1 * | 6/2002 | Hagiwara | G02F 1/1339 349/153 |
| 2003/0015342 | A1 | 1/2003 | Sakamoto et al. | |
| 2003/0076308 | A1 * | 4/2003 | Sano | G06F 3/0436 345/177 |
| 2004/0183484 | A1 * | 9/2004 | Ide | H01R 12/7076 315/366 |
| 2007/0013857 | A1 * | 1/2007 | Chung | G02F 1/13452 349/152 |
| 2008/0001619 | A1 * | 1/2008 | Igarashi | H01J 9/42 324/756.01 |
| 2008/0036932 | A1 * | 2/2008 | Lee | G02F 1/133707 349/38 |
| 2010/0277448 | A1 * | 11/2010 | Okamoto | H05K 1/189 345/206 |
| 2011/0147747 | A1 * | 6/2011 | Jeon | H01L 27/1248 257/59 |
| 2011/0267320 | A1 * | 11/2011 | Hu | G02F 1/13452 345/204 |
| 2013/0344693 | A1 * | 12/2013 | Suzuki | H01L 24/81 438/613 |
| 2015/0103500 | A1 * | 4/2015 | Bae | H01L 24/06 361/749 |
| 2015/0163911 | A1 * | 6/2015 | Lee | H01L 51/003 361/750 |
| 2015/0194109 | A1 * | 7/2015 | Fujikawa | G02F 1/1309 345/100 |
| 2015/0201492 | A1 | 7/2015 | Kim et al. | |
| 2015/0255487 | A1 * | 9/2015 | Yoshida | G02F 1/1368 257/43 |
| 2015/0332644 | A1 * | 11/2015 | Fujikawa | G02F 1/13452 345/100 |
| 2016/0209954 | A1 * | 7/2016 | Cho | G06F 3/044 |
| 2016/0224170 | A1 * | 8/2016 | Kim | G06F 3/044 |
| 2016/0286649 | A1 * | 9/2016 | Choi | H05K 1/147 |
| 2018/0020550 | A1 * | 1/2018 | Jang | H05K 1/111 |
| 2018/0040576 | A1 * | 2/2018 | Kim | H01L 27/323 |
| 2018/0047315 | A1 | 2/2018 | Li et al. | |
| 2018/0090442 | A1 * | 3/2018 | Li | H01L 23/5386 |
| 2018/0113546 | A1 * | 4/2018 | Sasabayashi | G06F 3/045 |
| 2018/0277505 | A1 * | 9/2018 | Hayashi | H01L 24/29 |
| 2019/0067406 | A1 * | 2/2019 | Lee | H01L 27/3262 |
| 2020/0233245 | A1 * | 7/2020 | Li | G02F 1/1333 |

FOREIGN PATENT DOCUMENTS

| | | |
|---|---|---|
| CN | 102686026 A | 9/2012 |
| CN | 105551378 A | 5/2016 |
| CN | 105720028 A | 6/2016 |
| CN | 205376002 U | 7/2016 |
| JP | 2008198687 A | 8/2008 |

* cited by examiner

FLEXIBLE ASSEMBLY FOR DISPLAY DEVICE AND DISPLAY DEVICE

CROSS-REFERENCE TO RELATED APPLICATION

This application is the U.S. national phase of PCT Application No. PCT/CN2019/079847 filed on Mar. 27, 2019, which claims a priority to Chinese Patent Application No. 201810551451.2 filed on May 31, 2018, the disclosures of which are incorporated in their entireties by reference herein.

TECHNICAL FIELD

The present disclosure relates to the field of display technology, in particular to a flexible assembly for a display device and the display device.

BACKGROUND

Flexible display technology is a research hotspot in the field of display technology in recent years and is widely used due to advantages of lightness, thinness, good shock resistance and good impact resistance. At present, a display device manufactured by using a flexible panel includes a liquid crystal display device, an organic electroluminescent display device or an electrophoretic display device, which can be applied to manufacturing a smart card, a portable computer and an electronic paper, and the like.

SUMMARY

A flexible assembly for a display device is provided by some embodiments of the present disclosure. The flexible assembly of the display device includes a flexible substrate and a first output pad, a second output pad, a third output pad and a fourth output pad arranged on the substrate. The first output pad, the second output pad, the third output pad and the fourth output pad are sequentially arranged along a first direction and spaced apart from each other. A pitch is between each output pad and an adjacent output pad, and the pitch is a sum of a spacing distance between each output pad and the adjacent output pad and a width of the adjacent output pad in the first direction. The pitch between the first output pad and the adjacent second output pad is smaller than the pitch between the third output pad and the adjacent fourth output pad.

Optionally, pitches between every output pads and the adjacent output pads are gradually increased in the first direction.

Optionally, the flexible assembly further includes four other output pads arranged in a same row with the first output pad, the second output pad, the third output pad and the fourth output pad. The first output pad, the second output pad, the third output pad and the fourth output pad and the four other output pads are symmetrically arranged with respect to an axis of symmetry; and the axis of symmetry is perpendicular to the first direction.

Optionally, a distance from the first output pad to the axis of symmetry is smaller than a distance from the third output pad to the axis of symmetry.

Optionally, the second output pad is located on a side of the first output pad away from the axis of symmetry; and the fourth output pad is located on a side of the third output pad away from the axis of symmetry.

Optionally, a plurality of output pads on one side of the axis of symmetry is divided into at least two output pad sets, and each of the at least two output pad sets comprises at least one output pad.

Optionally, a plurality of output pads on one side of the axis of symmetry is divided into at least two output pad sets, the number of the output pads in each of the at least two output pad sets is at least two, and in each of the at least two output pad sets, a pitch between any one output pad and a corresponding output pad adjacent to the any one output pad is equal to a pitch between any other one output pad and a corresponding output pad adjacent to the any other one output pad.

Optionally, in a direction from the axis of symmetry to a position away from the axis of symmetry, pitches of the at least two output pad sets are sequentially increased, and the pitch of each output pad set refers to a pitch between any adjacent output pads in the each output pad set.

Optionally, in a direction perpendicular to the axis of symmetry, a spacing distance between any one output pad and an output pad adjacent to the any one output pad is equal to a spacing distance between any other one output pad and an output pad adjacent to the any other one output pad.

Optionally, in a direction perpendicular to the axis of symmetry, a width of any one output pad is equal to a width of any other one output pad.

Optionally, a virtual extension line of each output pad in an extending direction intersects the axis of symmetry at one position point.

Optionally, among the plurality of output pads sequentially arranged and spaced apart from each other along a direction perpendicular to the axis of symmetry, for an output pad having a farther distance from the axis of symmetry, an angle between the virtual extension line of the output pad and the axis of symmetry is larger.

Optionally, the axis of symmetry is a center line of the substrate.

Optionally, the flexible assembly comprises a flexible panel or a chip on film.

A display device is further provided according to embodiments of the present disclosure, which includes a first flexible assembly. The first flexible assembly is the flexible assembly as described above.

Optionally, the first flexible assembly is the flexible panel, the display device further includes a second flexible assembly, the second flexible assembly is the flexible assembly as described above, and the second flexible assembly is a chip on film. Output pads on the first flexible assembly are bonded with output pads on the second flexible assembly in a one-to-one correspondence.

Optionally, in a plurality of output pads arranged on one of the first flexible assembly and the second flexible assembly, a spacing distance between any adjacent output pads in the first direction is equal to a spacing distance between any other adjacent output pads in the first direction, and in a plurality of output pads arranged on the other of the first flexible assembly and the second flexible assembly, a width of any one output pad is equal to a width of any other one output pad in the first direction.

Optionally, in a plurality of output pads arranged in the first direction and on the first flexible assembly, a spacing distance between any adjacent output pads in the first direction is equal to a spacing distance between any other adjacent output pads in the first direction; and in a plurality of output pads arranged on the second flexible assembly, a width of any one output pad is equal to a width of any other one output pad in the first direction.

Optionally, an extending direction of each output pad on the first flexible assembly is the same as an extending direction of a corresponding output pad on the second flexible assembly bonded with the each output pad, and an extension length of each output pad on the second flexible assembly is larger than an extension length of a corresponding output pad on the first flexible assembly bonded with the each output pad.

DETAILED DESCRIPTION

In order to make technical problems to be solved by the present disclosure, technical solutions and advantages clearer, specific embodiments will be described in detail below in conjunction with drawings.

In the related art, a process for manufacturing a flexible display device has been greatly developed. Generally, a flexible panel is fixed onto a glass substrate, and then a process of manufacturing a back plate is performed. The process is compatible with an apparatus for manufacturing a liquid crystal display. After a manufacture of the flexible display panel is completed, the flexible panel needs to be separated from the glass substrate, a film (back film) is attached to a back surface of the flexible panel to planarize the flexible panel, and then processes such as bonding and cutting of a chip on film (COF) is performed.

Since the flexible panel removed from the glass substrate is thin and easily deformed, the flexible panel is easily subjected to a force when the back film is attached, resulting in a slight change of size. Since the output pad (Pad) is arranged densely and sensitive to the change of size, the Pad on the flexible panel and the Pad on the COF may be misaligned when COF bonding is performed, which causes a failure to a circuit and adversely affects a yield.

A flexible assembly for a display device is provided, so as to solve a problem that a failure occurs to a circuit in the process of manufacturing a flexible panel in the related art, which is caused by that the Pad on the flexible panel and the Pad on the COF are misaligned due to a deformation of the flexible panel when COF bonding is performed. The flexible assembly may be formed as the flexible panel provided with the Pad or as the COF provided with the Pad. The problem that a failure occurs to the circuit caused by that the Pad on the flexible panel and the Pad on the COF are misaligned when the flexible panel is bonded with the COF is to be solved by improving an arrangement of the Pad on the flexible panel and/or the Pad on the COF.

It can be understood that the flexible assembly described in embodiments of the present disclosure is not limited to being only applied to the flexible display device, that is, not limited to being only the flexible panel or the COF. The flexible assembly may be any flexible substrate provided with the Pad to achieve that, when it is bonded with another substrate provided with the Pad, and the flexible assembly according to the embodiments of the present disclosure is applied, the deformation of the flexible substrate can not cause the Pads on the two substrates to be misaligned.

A specific structure of the flexible assembly according to some embodiments of the present disclosure will be described below by taking an example that the flexible assembly is applied to a flexible display device.

In some embodiments of the present disclosure, the flexible assembly may be formed as a flexible panel on the flexible display device.

Figure 1:
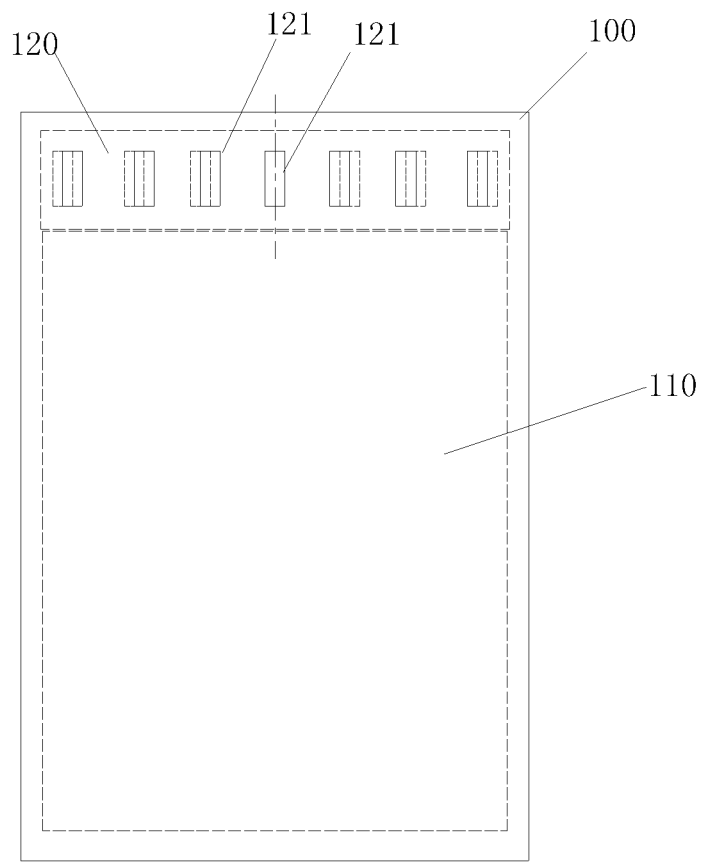
FIG. 1 is a structural schematic view of a flexible panel.

As shown in FIG. 1, in the case that the flexible assembly is the flexible panel, the flexible panel includes a flexible substrate 100. A display region 110 and a bonding region 120 are provided on the flexible substrate 100.

In some embodiments of the present disclosure, a flexibility of the substrate 100 refers to bendable and deformable characteristics of the substrate 100, and generally the substrate 100 is thin, so as to ensure the bendable and deformable characteristics of the substrate 100.

Further, a plurality of output pads 121 is arranged on the bonding region 120, and typically the plurality of output pads 121 is arranged in an array. According to FIG. 1, since the substrate 100 has the flexibility, the substrate 100 is easily deformed when a back film is attached to it, and the size of the substrate 100 may slightly change, resulting in a change of a spacing distance between the output pads 121 on the bonding region 120. The farther a distance from the output pad to a middle position is, the greater the amount of change in the spacing distance between the output pad and an output pad 121 adjacent to the output pad is, and the more likely the alignment deviation occurs when the output pads of the substrate is aligned with pads of the COF.

Figure 2:
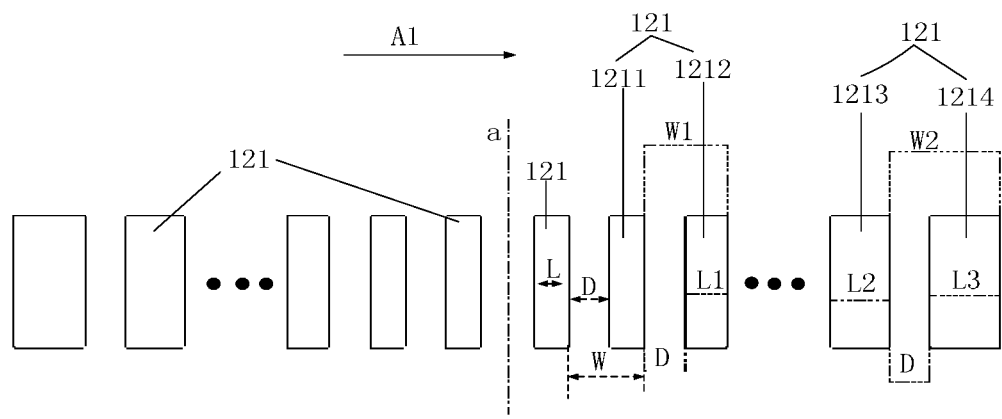
FIG. 2 is a structural schematic view of an output pad in a flexible assembly for a display device according to some embodiments of the present disclosure.

In view of the above problems, the flexible assembly is provided by some embodiments of the present disclosure, which is applied to a flexible display panel. As shown in FIG. 2, in the plurality of output pads 121, when the plurality of output pads 121 is sequentially spaced apart along a first direction A1 (as shown in FIG. 2) perpendicular to a predetermined axis of symmetry a, and a pitch W is between each output pad 121 and an output pad 121 adjacent to the each output pad, the pitch W is in the first direction perpendicular to the predetermined axis of symmetry a is a sum of a spacing distance D between each output pad 121 and the adjacent output pad 121 and a width of the adjacent output pad 121.

In some embodiments of the present disclosure, the plurality of output pads 121 is respectively arranged on both sides of the predetermined axis of symmetry a, and for the output pads located on one side of the predetermined axis of symmetry a, the pitch W1 between the first output pad 1211 and the adjacent second output pad 1212 is smaller than the pitch W2 between the third output pad 1213 and the adjacent fourth output pad 1214. A distance from the first output pad 1211 to the predetermined axis of symmetry a is smaller than a distance from the third output pad 1213 to the predetermined axis of symmetry a.

Specifically, the plurality of output pads 121 are arranged along a direction away from the predetermined axis of symmetry a from the predetermined axis of symmetry a, pitches W between all the adjacent output pads 121 are non-uniform, and the pitch W between the two output pads 121 away from the predetermined axis of symmetry a is increased compared to the pitch W between the two output pads near the predetermined axis of symmetry a, so as to adapt to the amount of the deformation of the substrate 100 when the back film is attached. In the first direction away from the predetermined axis of symmetry a, as the pitch between any adjacent output pads 121 becomes larger, a corresponding alignment region of Pad becomes larger.

In some embodiments of the present disclosure, the predetermined axis of symmetry a is an axis of symmetry provided for the plurality of output pads 121. Optionally, the plurality of output pads 121 is distributed on both sides of the predetermined axis of symmetry a, and in a plurality of output pads 121 of a same row, the number of the output pads 121 arranged on one side of the predetermined axis of symmetry a is equal to the number of the output pads 121 arranged on the other side of the predetermined axis of symmetry a. Optionally, the plurality of output pads 121 respectively located on the two sides of the predetermined axis of symmetry are symmetrically arranged with respect to the predetermined axis of symmetry a.

Optionally, as shown in FIG. 1, the predetermined axis of symmetry a may be an axis of symmetry or a center line of the substrate 100.

In some embodiments of the present disclosure, as shown in FIG. 2, in an arrangement of the plurality of output pads 121, the arrangement of the output pads 121 on the substrate 100 is described by taking the output pads 121 provided on the substrate 100 as an example. It can be understood that a plurality of rows of output pads 121 may be arranged on the substrate 100, each row of the output pads 121 may be sequentially arranged in the direction perpendicular to the predetermined axis of symmetry a, and each row of the output pads 121 may be arranged in a same manner as shown in FIG. 2.

In order to clearly illustrate the specific manner that the output pads 121 are arranged on the substrate 100, the pitch W between two adjacent output pads 121 is defined in the embodiments of the present disclosure. The pitch W specifically refers to the pitch between one output pad 121 and the other output pad 121 adjacent to the side of the one output pad 121 away from the predetermined axis of symmetry a. Optionally, as shown in FIG. 2, the second output pad 1212 adjacent to the first output pad 1211 is located on a side of the first output pad 1211 away from the predetermined axis of symmetry, and the fourth output pad 1214 adjacent to the third output pad 1213 is located on a side of the third output pad 1213 away from the predetermined axis of symmetry a.

As shown in FIG. 2, in one implementation structure of the flexible assembly according to an embodiment of the present disclosure, among the plurality of output pads 121, in the direction perpendicular to the predetermined axis of symmetry a, a spacing distance D between any one output pad 121 and its adjacent output pad 121 is equal to a spacing distance D between any other output pad 121 and its adjacent output pad 121. Based on such arrangement, in order to achieve that the pitch W2 between the third output pad 1213 and the adjacent fourth output pad 1214 is larger than the pitch W1 between the first output pad 1211 and the adjacent second output pad 1212, the width L of the fourth output pad 1214 in the direction perpendicular to the predetermined axis of symmetry a may be increased. That is, the width L3 of the fourth output pad 1214 is larger than the width L2 of the second output pad 1212. In such a manner, since the width of the fourth output pad 1214 is increased, the alignment region of the Pad is widened to ensure an accuracy of alignment between the Pads on the substrate 100 and the Pads on the COF.

Figure 3:
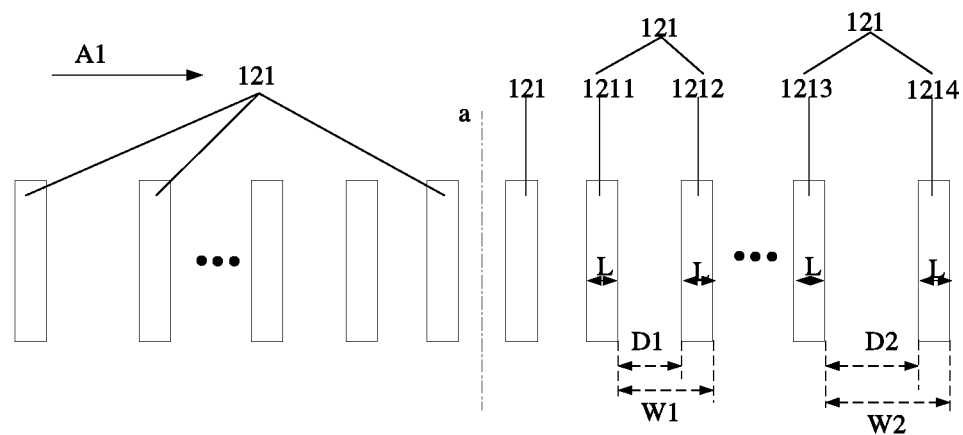
FIG. 3 is a structural schematic view of an output pad in a flexible assembly for a display device according to some embodiments of the present disclosure.

As shown in FIG. 3, in an implementation structure of the flexible assembly in some embodiments of the present disclosure, among the plurality of output pads 121, in the first direction A1 perpendicular to the predetermined axis of symmetry a, the widths L of the output pads 121 are equal. Based on the arrangement, the pitch W2 between the third output pad 1213 and the adjacent fourth output pad 1214 is larger than the pitch W1 between the first output pad 1211 and the adjacent second output pad 1212. The above arrangement can be achieved by increasing the spacing distance D between the third output pad 1213 and the fourth output pad 1214. Thus, since the spacing distance between the two adjacent output pads 121 is increased, positions of the Pads on the substrate 100 can adapt to alignment position of the Pads on the COF which is slightly deformed. Therefore, the Pads on the substrate 100 with the Pads on the COF are more accurately aligned.

Further, in one of the implementation structures of the flexible assembly in some embodiments of the present disclosure, as shown in FIG. 2 and FIG. 3, optionally, for the plurality of output pads 121 located on a side of the predetermined axis of symmetry a, the pitch between each output pad 121 and the adjacent output pad 121 is sequentially increased from the predetermined axis of symmetry a and along the direction away from the predetermined axis of symmetry a. Based on the arrangement, as the distance between the output pad 121 and the predetermined axis of symmetry a increases, the pitch W between the output pad 121 and the adjacent other output pad 121 also increases in sequence.

In the implementation structure shown in FIG. 2, spacing distances D between every adjacent output pads 121 are equal in the direction perpendicular to the predetermined axis of symmetry a. Therefore, when the pitch between the output pad 121 and the adjacent output pad 121 sequentially increases in a direction from the predetermined axis of symmetry a to a position away from the predetermined axis of symmetry a, the width of the output pad 121 gradually increases as the distance between it and the predetermined axis of symmetry a increases.

In the implementation structure shown in FIG. 3, widths L of all the output pads 121 are equal in the direction perpendicular to the predetermined axis of symmetry a. Therefore, when the pitch between the output pad 121 and the adjacent output pad 121 sequentially increases from the predetermined axis of symmetry a and along a direction away from the predetermined axis of symmetry a, the spacing distance D between two adjacent output pads 121 gradually increases as the distance between it and the predetermined axis of symmetry a increases.

Figure 4:
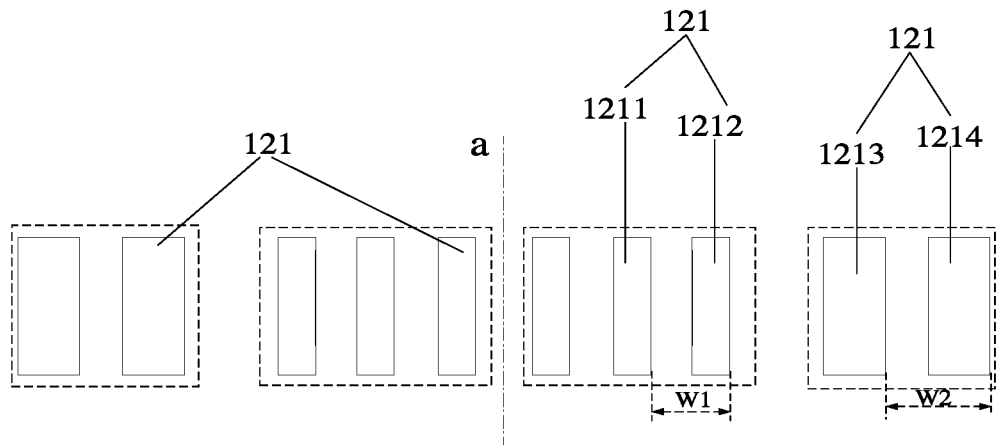
FIG. 4 is a structural schematic view of an output pad in a flexible assembly for a display device according to some embodiments of the present disclosure.

As shown in FIG. 4, in another implementation structure of the flexible assembly according to some embodiments of the present disclosure, a plurality of output pads 121 on one side of the axis of symmetry a is divided into at least two output pad sets. Each output pad set includes at least one output pad 121. In a case that the number of output pads 121 in each output pad set is at least two, pitches W between different output pads 121 in each output pad set and corresponding output pads 121 adjacent to the different output pads are equal. Optionally, in a case that the number of output pads 121 in each output pad set is at least two, widths L of all the output pads 121 in each output pad set are equal, and all the spacing distances between every adjacent two output pads 121 in each output pad set are equal.

Optionally, in a direction from the axis of symmetry a to a position away from the axis of symmetry a, pitches of the at least two output pad sets are sequentially increased, and the pitch of each output pad set refers to a pitch between any adjacent output pads in the each output pad set.

For example, as shown in FIG. 4, the first output pad 1211 and the second output pad 1212 are located in the same output pad set, and the third output pad 1213 and the fourth output pad 1214 are located in the same output pad set. A distance between the output pad set in which the third output pad 1213 is located and the predetermined axis of symmetry a is larger than the distance between the output pad set in which the first output pad 1211 is located and the predetermined axis of symmetry a. Therefore, the pitch W2 between the third output pad 1213 and the fourth output pad 1214 is larger than the pitch W1 between the first output pad 1211 and the second output pad 1212.

Optionally, as to the two adjacent output pad sets, for a fifth output pad located in the first output pad set adjacent to the second output pad set and a sixth output pad located in the second output pad set adjacent to the first output pad set, a pitch W between the above two adjacent output pads 121 is equal to the pitch between any two adjacent output pads 121 in the first output pad set, or is equal to the pitch between any two adjacent output pads 121 in the second output pad set, so as to conform to the arrangement that pitches between every adjacent output pads 121 are sequentially increased in the direction from the predetermined axis of symmetry a to a position away from the predetermined axis of symmetry a.

As shown in FIG. 4, according to the structure of the arrangement as described above, in order to enable pitches of a plurality of output pad sets to be sequentially increased in the direction from the predetermined axis of symmetry a to a position away from the predetermined axis of symmetry a, where the pitch of each output pad set refers to a pitch between any adjacent output pads in the each output pad set, spacing distances D between every adjacent output pads 121 in each output pad set are equal, and pitches of different output pad sets are increased in the direction. It can be understood that the implementation structure as described above may also be achieved by that widths L of all the output pads 121 in each output pad set are equal, and spacing distances D in the different output pad sets are increased in the direction, where a spacing distance D in each output pad set refers to a spacing distance between any two adjacent output pads 121, which will not illustrated herein again by adding new drawings.

In the flexible assembly of the implementation structure as shown in FIGS. 2 to 4, on the substrate 100, the extending direction of each of the output pads 121 is parallel to the predetermined axis of symmetry a.

Figure 5:
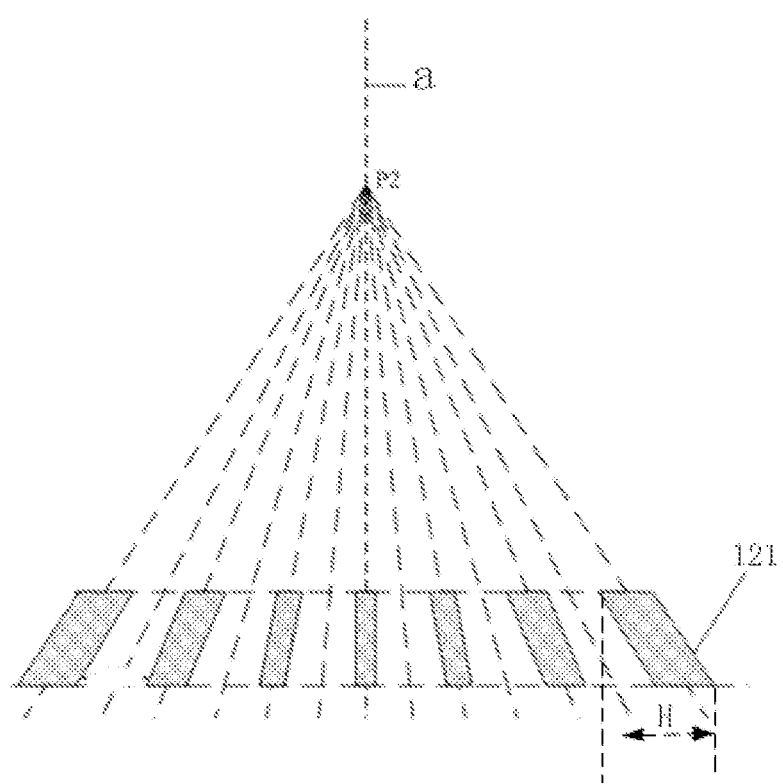
FIG. 5 is a structural schematic view of an output pad in a flexible assembly for a display device according to some embodiments of the present disclosure.

Optionally, as shown in FIG. 5, according to the flexible assembly of the implementation structure as described above, on the substrate, virtual extension lines of all the output pads 121 in the extending direction intersect at a certain position point P2 on the predetermined axis of symmetry a. According to the arrangement, the output pad 121 is inclined relative to the predetermined axis of symmetry a such that the output pad 121 extends in the direction parallel to the predetermined axis of symmetry a. In the direction perpendicular to the predetermined axis of symmetry a, an alignment width H of the output pad 121 is increased compared to the output pad 121 in a vertical state, so as to compensate for variations in an overall size of the substrate 100 (as shown in FIG. 1), and increase the alignment accuracy when aligning with the Pads on the COF.

Optionally, as shown in FIG. 5, among the plurality of output pads 121 sequentially arranged at intervals along the direction perpendicular to the predetermined axis of symmetry a, the farther a distance between an output pad 121 and the predetermined axis of symmetry a is, the larger the angle between the virtual extension line of the output pad 121 and the predetermined axis of symmetry a is, so that the farther the distance between an output pad 121 and the predetermined axis of symmetry a is, the larger the alignment width H of the corresponding output pad 121 is, so as to adapt to the deformation of the substrate 100. Therefore, at a position away from the predetermined axis of symmetry a, the accuracy of alignment between Pads the substrate 100 and the Pads on the COF are ensured.

In some embodiments of the present disclosure, as shown in FIG. 5, the arrangement of the output pad 121 inclined with respect to the predetermined axis of symmetry a can be combined with any one of the implementation structures of FIGS. 2 to 4. According to each of the output pads 121 inclined with respect to the predetermined axis of symmetry a, the virtual extension line in the extending direction of each output pad intersects at a position on the predetermined axis of symmetry a. The pitches W between every two adjacent output pads 121 are non-uniform in the direction from the predetermined axis of symmetry a and along a direction away from the predetermined axis of symmetry a; and a pitch W between two output pads 121 away from the predetermined axis of symmetry a is larger than a pitch W between two output pads near the predetermined axis of symmetry a. The combination of the two implementation structures can effectively solve the problem that the Pads on the two substrates are misaligned as the flexible substrate 100 is deformed when the Pads on the flexible substrate 100 are bonded with the Pads on the other flexible substrate 100.

It should be noted that the virtual extension line as mentioned in the above implementation structure is an extension line that does not really exist (virtual) in the output pad 121 in the extending direction.

In the implementation structures as shown in FIG. 2 to FIG. 5, the flexible assembly is the flexible panel in the flexible display device as an example for detailed description. In the flexible assembly of each of the above implementation structures, the flexible assembly may be the COF in the flexible display device. The specific structure of the output pad provided on the COF can be implemented according to any of the implementation structures as shown in FIGS. 2 to 5.

Specifically, the specific structure of the output pad provided by the COF may adopt any one of the above implementation structures as shown in FIG. 2 to FIG. 5, and reference may be made to the above detailed description, which will not be described in detail herein.

The flexible assembly according to the embodiments of the present disclosure can be formed as the flexible panel or COF in the flexible display device. It should be noted that the flexible assembly is not limited to be only the flexible panel or the COF in the flexible display device, any of assemblies made of a flexible substrate and provided with Pads bonded with Pads on another substrate can be applied to the structure of the flexible assembly of the embodiments of the present disclosure.

For example, the COF for fitting to and connecting with a hard material substrate can be applied to the structure of the flexible assembly in the embodiments of the present disclosure.

In addition, a display device is further provided according to some embodiments of the present disclosure. The display device includes the flexible assembly according to any one of the above embodiments.

Specifically, the flexible assembly includes a first flexible assembly formed as the flexible panel and a second flexible assembly formed as the COF. Output pads on the first flexible assembly are bonded with and connected to output pads on the second flexible assembly in a one-to-one correspondence.

Optionally, in a case that in a plurality of output pads arranged on one of the first flexible assembly and the second flexible assembly, a spacing distance between any adjacent output pads is equal to a spacing distance between any other adjacent output pads in the direction perpendicular to the predetermined axis of symmetry, widths of all the output pads arranged on the other one of the first flexible assembly and the second flexible assembly are equal in the direction perpendicular to the preset axis of symmetry.

Optionally, in a plurality of output pads arranged on the first flexible assembly formed as the flexible panel, spacing distances between every adjacent output pads are equal in the direction perpendicular to the predetermined axis of symmetry; and in a plurality of output pads arranged on the second flexible assembly formed as the COF, widths of all the plurality of output pads are equal in the direction perpendicular to the predetermined axis of symmetry.

Figure 6:
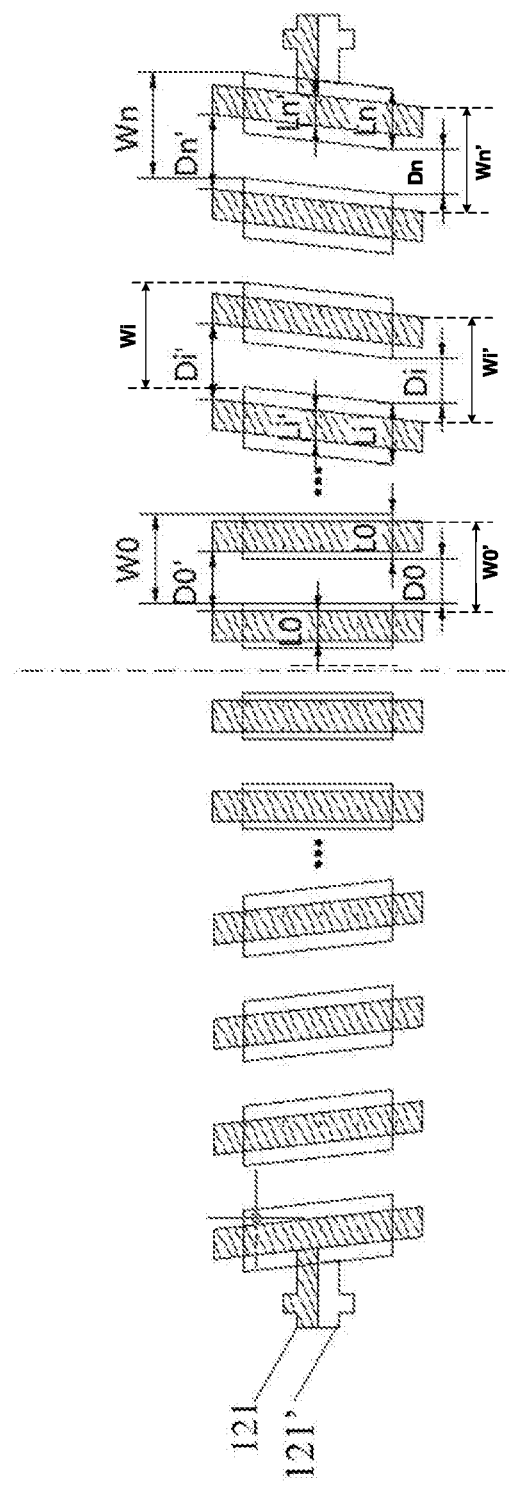
FIG. 6 is a structural schematic view of an output pad in a display device according to some embodiments of the present disclosure.

For example, as shown in FIG. 6, for the plurality of output pads, output pads denoted by a shaded region are output pads 121 on the COF, and output pads without being shaded (i.e. blank region) are output pads 121' on the flexible panel. In one of the implementation structures of the display device according to some embodiments of the present disclosure, as for the output pads 121' on the flexible panel, in the direction perpendicular to the predetermined axis of symmetry a, spacing distances D0, . . . , Di between every adjacent output pads 121' are equal, and widths L0, . . . , Li, Ln of the respective output pads 121' are sequentially increased, so that the pitches W0, . . . , Wi, Wn between any adjacent output pads 121' on the flexible panel are sequentially increased.

As for the output pads 121 on the COF, in the direction perpendicular to the predetermined axis of symmetry a, widths L0', . . . , Li', Ln' of the respective output pads 121 are equal, spacing distances D0', . . . , Di', Dn' between every adjacent output pad 121 are sequentially increased, so that pitches W0', . . . , Wi', Wn' between any adjacent output pads 121' on the flexible panel are sequentially increased.

In other words, all the output pads 121' on the flexible panel are arranged in a structure that spacing distances between all the adjacent output pads are equal and widths of all the output pads are sequentially increased in the direction from the predetermined axis of symmetry a to a position away from the predetermined axis of symmetry a, and all the output pads 121 on the COF are arranged in a structure that the widths of all the output pads are equal, and the spacing distances between all the adjacent output pads are sequentially increased. According to such arrangement manner, when the back film is adapted to and bonded with Pads on the flexible panel, the flexible panel is deformed, for an output pad having a farther distance between the axis of symmetry and it, an amount of change in the spacing distance between the output pad and its adjacent the output pad is larger, and accordingly, deviation of a position of each Pad on the flexible panel with respect to a corresponding position of the COF can be avoided by gradually increasing widths in the direction. Further, the arrangement of the Pads on the COF adapt to the deformation of the flexible panel and also adapt to a situation that spacing distances between every two adjacent Pads on the flexible panel are increased in the direction, by increasing a spacing distance between any adjacent Pads on the COF in the direction.

Therefore, according to the arrangement manners as described above, the problem can be effectively solved that a failure occurs to a circuit when pads on the flexible panel are bonded with pads on the COF, which is caused by that the pads on the flexible panel and the pads on the COF are misaligned due to a deformation of the flexible panel when COF bonding is performed.

Further, as shown in FIG. 5, in some embodiments of the present disclosure, the output pad 121' on the flexible panel and the output pad 121 on the COF are each formed as an inclined structure with respect to the predetermined axis of symmetry a. The virtual extension lines of the output pads 121' on the flexible panel and the virtual extension lines of the output pads 121 on the COF in the extending direction intersect at the same position on the predetermined axis of symmetry a. Two output pads respectively arranged on the flexible panel and the COF in a correspondence have a same inclined direction with respect to the predetermined axis of symmetry a. That is, each output pad arranged on the flexible panel has a same extending direction with a corresponding output pad on the COF.

Further, optionally, an extension length of each output pad on the COF is larger than an extension length of a corresponding output pad on the flexible panel bonded with the each output pad.

Figure 7:
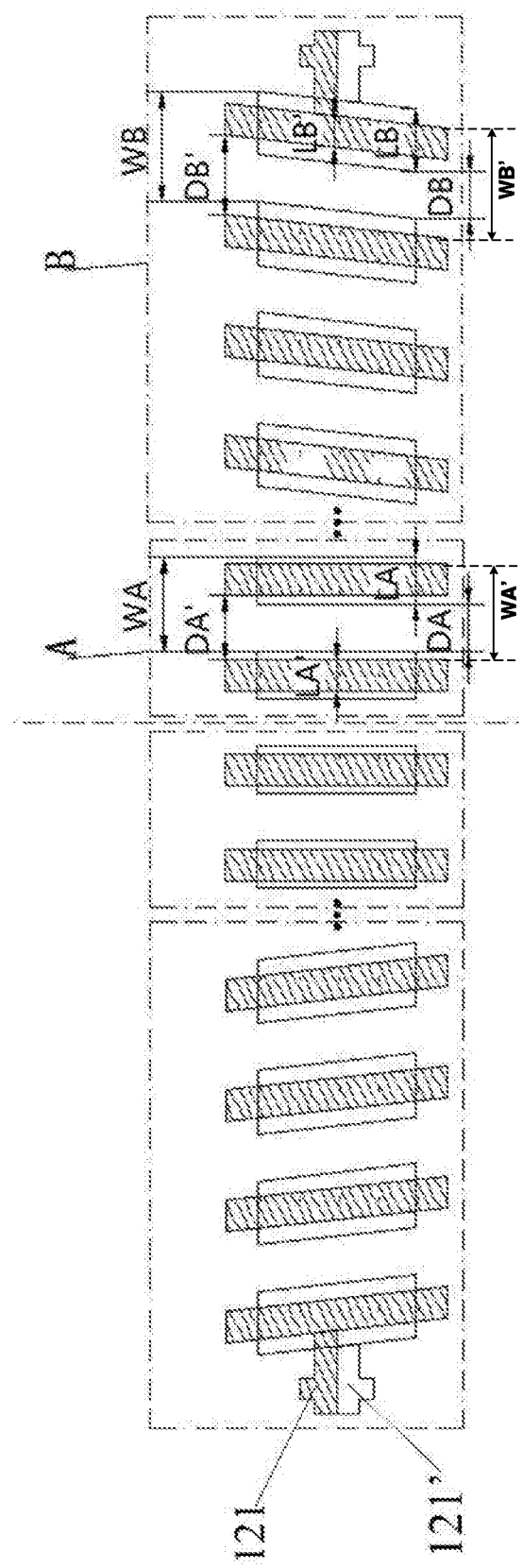
FIG. 7 is a structural schematic view of an output pad in a display device according to some embodiments of the present disclosure.

As shown in FIG. 7, in another implementation structure of the display device according to some embodiments of the present disclosure, the output pads 121' on the flexible panel and the output pads 121 on the COF respectively form at least two output pad sets. The output pads 121' on the flexible panel and the output pads 121 on the COF are arranged in one-to-one correspondence respectively. In the output pads 121' on the flexible panel or the output pads 121 on the COF, each of the at least two output pad sets includes at least one output pad. As for the output pads 121' on the flexible panel, when the number of output pads in each of the at least two output pad sets is at least two, pitches between different output pads in each output pad set and the corresponding output pads adjacent to the different output pads are equal. Specifically, when the number of output pads in each output pad set is at least two, widths L of all the output pads 121 in each output pad set are equal, and a spacing distance between any adjacent output pads 121 in each output pad set is equal to a spacing distance between any other adjacent output pads 121 in the each output pad set. Similarly, as for the output pads 121 on the COF, when the number of output pads in each output pad set is at least two, and pitches between different output pads in each output pad set and corresponding output pads adjacent to the different output pads are equal. Specifically, when the number of output pads in each output pad set is at least two, widths of all the output pads in each output pad set are equal, and a spacing distance between any adjacent output pads in each output pad set is equal to a spacing distance between any other adjacent output pads in the each output pad set.

In addition, in an implementation structure of the display device as shown in FIG. 7, as for the output pads 121' on the flexible panel and the output pads 121 on the COF, in the direction from the predetermined axis of symmetry a to a position away from the predetermined axis of symmetry a, pitches of the at least two output pad sets are sequentially increased, and the pitch of each output pad set refers to a pitch between any adjacent output pads in the each output pad set. For example, a distance between the output pad set B and the predetermined axis of symmetry a is larger than a distance between the output pad set A and the predetermined axis of symmetry a. Thus, as for the output pads 121' on the flexible panel, the pitch WB of the output pad and the adjacent output pad included in the output pad set B is larger than the pitch WA of the output pad and the adjacent output pad included in the output pad set A. Similarly, as for the output pads 121 on the COF, the pitch WB' of the output pad and the adjacent output pad included in the output pad set B is larger than the pitch WA' of the output pad and the adjacent output pad included in the output pad set A.

In some embodiments of the present disclosure, as for the output pads 121 on the COF, widths of all the output pads 121 are equal in the direction perpendicular to the predetermined axis of symmetry a. In the direction from the predetermined axis of symmetry a to a position from the predetermined axis of symmetry a, spacing distances between all the adjacent output pads in each output pad set are increased. As for the output pad 121' on the flexible panel, the spacing distances between all the adjacent output pads 121' are equal in the direction perpendicular to the predetermined axis of symmetry a. In the direction from the predetermined axis of symmetry a to a position away from the predetermined axis of symmetry a, the widths of all the output pads 121' in each output pad set are sequentially increased.

According to the above embodiments, the Pads on the flexible panel and the Pads on the COF are grouped, so as to arrange the Pads on the flexible panel and the Pads on the COF in one-to-one correspondence. Meanwhile, the problem can be effectively solved that a failure occurs to a circuit, which is caused by that the Pad on the flexible panel and the Pad on the COF are misaligned due to a deformation of the flexible panel when COF bonding is performed.

In the implementation structure of the display device as shown in FIG. 7, it should be understood that the output pad 121' on the flexible panel and the output pad 121 on the COF are formed as the inclined structure with respect to the predetermined axis of symmetry a, which is same as the implementation structure shown in FIG. 6. The virtual extension lines of the output pads 121' on the flexible panel and the virtual extension lines of the output pads 121 on the COF in the extending direction intersect at the same position on the predetermined axis of symmetry a. Two output pads respectively arranged on the flexible panel and the COF in a correspondence have a same inclined direction with respect to the predetermined axis of symmetry a. That is, each output pad arranged on the flexible panel has a same extending direction with a corresponding output pad on the COF.

It should be noted that, in the implementation structures shown in FIG. 7 and FIG. 4, as for the way of grouping the output pads, the grouped "set" is a virtual set just for classifying the different output pads based on the structure and an arrangement rule of the output pads.

In view of the above, according to the display device in the embodiments of the present disclosure as described above, in a direction from the middle position to the edge, widths of pads on the flexible panel are increased, and spacing distances between every adjacent pads on the COF are increased. In such a manner, a problem can be effectively solved that a failure occurs to a circuit, which is caused by that the pads on the flexible panel and the pads on the COF are misaligned due to a deformation of the flexible panel and the COF when COF bonding is performed, thereby achieving effects of improving a bonding precision and a bonding yield.

The above embodiments are merely optional embodiments of the present disclosure. It should be noted that numerous improvements and modifications may be made by those skilled in the art without departing from the principle of the present disclosure, and these improvements and modifications shall also fall within the scope of the present disclosure.

What is claimed is:

1. A flexible assembly for a display device, comprising:
a flexible substrate; and
a first output pad, a second output pad, a third output pad and a fourth output pad arranged on the substrate,
wherein the first output pad, the second output pad, the third output pad and the fourth output pad are sequentially arranged along a first direction and are spaced apart from each other, and a pitch is defined between each output pad and an adjacent output pad as a sum of a spacing distance between each output pad and the adjacent output pad and a width of the adjacent output pad in the first direction;
wherein the pitch between the first output pad and the adjacent second output pad is smaller than the pitch between the third output pad and the adjacent fourth output pad;
wherein the flexible assembly further comprises four other output pads arranged in a same row with the first output pad, the second output pad, the third output pad and the fourth output pad, wherein the first output pad, the second output pad, the third output pad and the fourth output pad are symmetrical to the four other output pads with respect to an axis of symmetry, and the axis of symmetry is perpendicular to the first direction; and
wherein in a direction perpendicular to the axis of symmetry, a spacing distance between any adjacent output pads on a first side of the axis of symmetry is equal to a spacing distance between any other adjacent output pads on the first side of the axis of symmetry, and a spacing distance between any adjacent output pads on a second side of the axis of symmetry is equal to a spacing distance between any other adjacent output pads on the second side of the axis of symmetry.

2. The flexible assembly according to claim 1, wherein the pitch between any two adjacent output pads is gradually increased in the first direction.

3. The flexible assembly according to claim 1, wherein a distance from the first output pad to the axis of symmetry is smaller than a distance from the third output pad to the axis of symmetry.

4. The flexible assembly according to claim 3, wherein the second output pad is located on a side of the first output pad away from the axis of symmetry, and the fourth output pad is located on a side of the third output pad away from the axis of symmetry.

5. The flexible assembly according to claim 1, wherein a plurality of output pads on one side of the axis of symmetry is divided into at least two output pad sets, and each of the at least two output pad sets comprises at least one output pad.

6. The flexible assembly according to claim 1, wherein a plurality of output pads on one side of the axis of symmetry is divided into at least two output pad sets, a number of the output pads in each of the at least two output pad sets is at least two, and in each of the at least two output pad sets, a pitch between any adjacent output pads is equal to a pitch between any other adjacent output pads; and wherein the first output pad and the second output pad are located in one output pad set, and the third output pad and the fourth output pad are located in another output pad set.

7. The flexible assembly according to claim 6, wherein in a direction from the axis of symmetry to a position away from the axis of symmetry, pitches of the at least two output pad sets are sequentially increased, and the pitch of each output pad set refers to a pitch between any two adjacent output pads in the output pad set.

8. The flexible assembly according to claim 1, wherein a virtual extension line of each output pad in an extending direction intersects the axis of symmetry at one position point.

9. The flexible assembly according to claim 8, wherein among a plurality of output pads sequentially arranged and spaced apart from each other along a direction perpendicular to the axis of symmetry, for an output pad having a farther distance from the axis of symmetry, an angle between the virtual extension line of the output pad and the axis of symmetry is larger.

10. The flexible assembly according to claim 1, wherein the axis of symmetry is a center line of the substrate.

11. The flexible assembly according to claim 1, wherein the flexible assembly comprises a flexible panel or a chip on film.

12. A display device, comprising a first flexible assembly, wherein the first flexible assembly comprises the flexible assembly according to claim 1.

13. The display device according to claim 12, wherein the first flexible assembly is a flexible panel, the display device further comprises a second flexible assembly, and the second flexible assembly is a chip on film; and wherein output pads on the first flexible assembly are bonded with output pads on the second flexible assembly in a one-to-one correspondence.

14. The display device according to claim 13, wherein in a plurality of output pads arranged in the first direction and on the first flexible assembly, a spacing distance between any adjacent output pads in the first direction is equal to a spacing distance between any other adjacent output pads in the first direction; and in a plurality of output pads arranged on the second flexible assembly, a width of any one output pad is equal to a width of any other one output pad in the first direction.

15. The display device according to claim 13, wherein an extending direction of each output pad on the first flexible assembly is the same as an extending direction of a corresponding output pad on the second flexible assembly bonded with the each output pad, and an extension length of each output pad on the second flexible assembly is larger than an extension length of a corresponding output pad on the first flexible assembly bonded with the each output pad.

* * * * *